(12) United States Patent
Chun et al.

(10) Patent No.: US 11,837,636 B2
(45) Date of Patent: Dec. 5, 2023

(54) SEMICONDUCTOR MODULE AND METHOD FOR MANUFACTURING THE SAME (71) Applicants: Hyundai Motor Company, Seoul (KR); Kia Corporation, Seoul (KR)

(72) Inventors: Dae Hwan Chun, Suwon-si (KR); Junghee Park, Suwon-si (KR); Jungyeop Hong, Seoul (KR); Youngkyun Jung, Seoul (KR); NackYong Joo, Suwon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 80 days.

(21) Appl. No.: 17/544,193

(22) Filed: Dec. 7, 2021

(65) Prior Publication Data

US 2023/0016808 A1     Jan. 19, 2023

(30) Foreign Application Priority Data

Jul. 13, 2021  (KR) .................... 10-2021-0091660

(51) Int. Cl.
*H01L 21/02*     (2006.01)
*H01L 29/267*    (2006.01)
*H01L 29/06*     (2006.01)
*H01L 29/786*    (2006.01)

(52) U.S. Cl.
CPC ...... *H01L 29/267* (2013.01); *H01L 21/02378* (2013.01); *H01L 21/02381* (2013.01); *H01L 21/02488* (2013.01); *H01L 21/02494* (2013.01); *H01L 29/06* (2013.01); *H01L 29/7869* (2013.01)

(58) Field of Classification Search
CPC ....................... H01L 29/267; H01L 21/02378
See application file for complete search history.

(56) References Cited

U.S. PATENT DOCUMENTS

2019/0067432 A1*  2/2019  Fujimaki ........... H01L 29/41758
2021/0234015 A1*  7/2021  Lee .................... H01L 29/1606

* cited by examiner

*Primary Examiner* — Farun Lu
*Assistant Examiner* — Sandra Milena Rodriguez Villanu
(74) *Attorney, Agent, or Firm* — Slater Matsil, LLP (57) ABSTRACT

An embodiment semiconductor module includes a substrate, a heterogeneous thin film including a first semiconductor layer disposed on a first region of the substrate and a second semiconductor layer disposed on a second region of the substrate, a first semiconductor device disposed on the first semiconductor layer of the heterogeneous thin film, and a second semiconductor device disposed on the second semiconductor layer of the heterogeneous thin film, wherein one of the first semiconductor layer or the second semiconductor layer comprises gallium oxide ($Ga_2O_3$) and the other includes silicon (Si).

20 Claims, 7 Drawing Sheets

SEMICONDUCTOR MODULE AND METHOD FOR MANUFACTURING THE SAME

CROSS-REFERENCE TO RELATED APPLICATIONS

This application claims the benefit of Korean Patent Application No. 10-2021-0091660, filed on Jul. 13, 2021, which application is hereby incorporated herein by reference.

TECHNICAL FIELD

The present disclosure relates to a semiconductor module and a method for manufacturing the same.

BACKGROUND

A power semiconductor module (or a power module) is to modularize several power semiconductor devices in one package. A type, the number, and specification of the power semiconductor devices inside the power semiconductor module may be changed depending on conditions required by a system. In addition, the power semiconductor devices may be manufactured into various package types according to application fields and system conditions.

The power semiconductor module is widely used as a core component of a converter and an inverter in automobiles, power plants, home appliances, trains, and the like. For example, in order to form a Lorentz force, on which a rotational motion that drives a motor for electric vehicles is based, a three-phase power semiconductor module is used. In other words, the three-phase power semiconductor module controls flow of a current and power injected into the motor. Herein, power semiconductors inside the power semiconductor module perform a turn-on/off operation and serve as an electrical switch. The turn-on/off operation of the power semiconductors is commanded and controlled by a gate driver having a control circuit of the power semiconductor module. The power semiconductor module and the gate driver are combined with a cooling component, a controller, other passive elements, and the like, forming the inverter.

The gate driver for commanding and controlling the turn-on/off operation of the power semiconductors inside the power module is in general located outside the power module. As described above, the gate driver basically includes the control circuit for controlling the power module and may be designed to include various functions such as a protection circuit, a temperature sensor, a current sensor, and the like depending on situations. Accordingly, as a wire and a metal line for connecting the power semiconductors and the gate driver is longer, electrical parasitic components (capacitance, inductance) are increased and thus deteriorate switching characteristics, resultantly increasing volumes of the passive devices inside and outside the system.

SUMMARY

The present disclosure relates to a semiconductor module and a method for manufacturing the same. Particular embodiments relate to a semiconductor module capable of designing and manufacturing a gallium oxide ($Ga_2O_3$)-based semiconductor and a silicon (Si)-based semiconductor as one device, and a method for manufacturing the same.

An embodiment provides a semiconductor module capable of improving switching characteristics by reducing the electrical parasitic components (capacitance, inductance, etc.), reducing a weight and a volume of components of a system, and increasing the life-span and reliability of a device.

Another embodiment provides a method of manufacturing a semiconductor module.

According to an embodiment, a semiconductor module includes a substrate and a heterogeneous thin film including a first semiconductor layer disposed on a partial region on the substrate and a second semiconductor layer disposed on another partial region on the substrate, a first semiconductor device disposed on the first semiconductor layer of the heterogeneous thin film, and a second semiconductor device disposed on the second semiconductor layer of the heterogeneous thin film, wherein one of the first semiconductor layer and the second semiconductor layer includes gallium oxide ($Ga_2O_3$) and the other includes silicon (Si).

The substrate may include silicon (Si), silicon carbide (SiC), sapphire, or gallium oxide ($Ga_2O_3$).

The first semiconductor layer and the second semiconductor layer may be spaced apart from each other or a boundary between them may be a heterojunction.

A planar shape of a boundary between the first semiconductor layer and the second semiconductor layer may be a zigzag shape.

One of the first semiconductor layer and the second semiconductor layer may be disposed at both edges of the substrate and the other may be disposed between both edges of the substrate.

One of the first semiconductor layer and the second semiconductor layer may be disposed in a peripheral region on the substrate and the other may be disposed in an inner region surrounded by the peripheral region.

The peripheral region may have a quadrangular, circular, oval, or polygonal planar shape.

The inner region may have a quadrangular, circular, oval, polygonal or polygonal shape including protruding portions on corners or sides, or a cross-shaped planar shape.

The inner region may be divided into a plurality of portions, and each of the plurality of divided inner regions may be surrounded by a peripheral region.

The heterogeneous thin film may further include a second inner region surrounded by the inner region, and the second inner region may include the same semiconductor layer as the peripheral region.

The first semiconductor device may be a power semiconductor device.

The first semiconductor device may include a field effect transistor (FET), a metal-oxide-semiconductor field effect transistor (MOSFET), an insulated gate bipolar transistor (IGBT), a bipolar junction transistor (BJT), a Schottky diode, a PN diode, or a combination thereof.

The second semiconductor device may include a control element, a temperature sensor, a current sensor, a protection circuit, or a combination thereof.

The control element may include an integrated circuit (IC) including a capacitor, a resistor, an inductor, a complementary metal oxide semiconductor (CMOS), a field effect transistor (FET), a metal-oxide-semiconductor field effect transistor (MOSFET), a bipolar junction transistor (BJT), a diode, or a combination thereof.

Each of the first semiconductor device and the second semiconductor device may include an insulating layer, a metal layer, or a combination thereof.

The first semiconductor device and the second semiconductor device may be electrically connected by a wire or a metal line.

According to another embodiment, a method of manufacturing a semiconductor module includes forming a first semiconductor layer on a substrate, removing a partial region of the first semiconductor layer, and then forming a second semiconductor layer in the region from which the first semiconductor layer is removed to form a heterogeneous thin film, forming a first semiconductor device on a first semiconductor layer of the heterogeneous thin film, and forming a second semiconductor device on a second semiconductor layer of the heterogeneous thin film, wherein one of the first semiconductor layer and the second semiconductor layer includes gallium oxide ($Ga_2O_3$) and the other includes silicon (Si).

The forming of the heterogeneous thin film may include forming a first mask on a partial region of the first semiconductor layer, removing a partial region of the first semiconductor layer on which the first mask is not formed, removing the first mask, forming a second mask over the first semiconductor layer, forming a second semiconductor layer on the substrate and the second mask, and removing the second mask and the second semiconductor layer formed on the second mask.

The first mask may be reused as the second mask without removing the first mask.

The first mask and the second mask may each independently include a photoresist or an oxide.

The first semiconductor layer may be removed by dry etching or wet etching.

The second semiconductor layer may be deposited by hydride vapor phase epitaxy (HVPE), pulsed laser deposition (PLD), metal-organic chemical vapor deposition (MOCVD), or mist-chemical vapor deposition (Mist-CVD).

A deposition thickness of the second semiconductor layer may be about 0.1 μm to about 10 μm.

The second semiconductor layer may be removed by wet etching.

In the semiconductor module according to an embodiment, by optimizing and minimizing the length of a wire and a metal line for electrical connection, electrical parasitic components (capacitance, inductance, etc.) may be reduced to improve switching characteristics.

Accordingly, in the semiconductor module, a volume of passive devices inside and outside the system may be reduced by increasing a switching speed, and reducing switching energy loss to reduce heat generation, a weight and a volume of cooling parts are reduced by evenly distributing a heating portion according to the operation of the device or by artificially placing main devices that cause heat in a place where heat is emitted smoothly, and a weight and a volume of components of the system may be reduced, the system may be simplified, and the life-span and reliability of the device may be increased by increasing the energy use efficiency.

The following reference numbers may be used in connection with the drawings to describe exemplary embodiments.

100: substrate
200: heterogeneous thin film
220: first semiconductor layer
221: gallium oxide-based buffer layer
222: N− type gallium oxide epitaxial layer
223: N+ type gallium oxide epitaxial layer
224: first insulating layer
225: P-type region
226: N-type gallium oxide epitaxial layer
227: N-type region
230: second semiconductor layer
300: first semiconductor device
400: second semiconductor device
320: upper region of the first semiconductor layer
321: gate electrode
322: source electrode
323: drain electrode
324: second insulating layer
325: emitter electrode
326: base electrode
327: collector electrode
328: cathode
329: anode
420: upper region of second semiconductor layer
500: metal wire
610: first mask
620: second mask
A: second semiconductor layer removal region
B: first semiconductor layer removal region

DETAILED DESCRIPTION OF ILLUSTRATIVE EMBODIMENTS

The advantages and features of embodiments of the present disclosure and the methods for accomplishing the same will be apparent from the exemplary embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

A semiconductor module according to an embodiment includes a substrate and a heterogeneous thin film including a first semiconductor layer disposed on a partial region on the substrate, and a second semiconductor layer disposed on another partial region on the substrate, a first semiconductor device disposed on the first semiconductor layer of the heterogeneous thin film, and a second semiconductor device disposed on the second semiconductor layer of the heterogeneous thin film.

Figure 1:
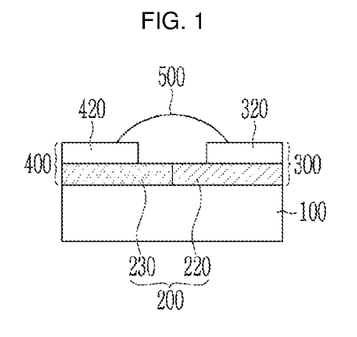
FIG. 1 is a view illustrating a cross-section of a semiconductor module according to an embodiment.

FIG. 1 is a view illustrating a cross-section of a semiconductor module according to an embodiment.

Referring to FIG. 1, the semiconductor module includes a substrate 100, a heterogeneous thin film 200 on the substrate 100, and a first semiconductor device 300 and a second semiconductor device 400 on the heterogeneous thin film 200.

The substrate 100 may include silicon (Si), silicon carbide (SiC), sapphire, or gallium oxide ($Ga_2O_3$). For example, the sapphire substrate has a small difference in lattice constant from the gallium oxide ($Ga_2O_3$) material, so that a highly crystalline gallium oxide ($Ga_2O_3$) thin film may be manufactured.

The heterogeneous thin film 200 is disposed on one surface of the substrate 100. The heterogeneous thin film 200 includes a first semiconductor layer 220 disposed on a partial region on the substrate 100 and a second semiconductor layer 230 disposed on another partial region on the substrate 100. In other words, the heterogeneous thin film 200 is divided into two regions in a horizontal direction, which are the first semiconductor layer 220 and the second semiconductor layer 230. Herein, the horizontal direction is a width direction of the substrate 100, and a vertical direction is a thickness direction of the substrate 100, which is perpendicular to the horizontal direction.

An insulator (not shown) may be disposed between the substrate 100 and the heterogeneous thin film 200. The insulator may include $Al_2O_3$, $SiO_2$, $HfO_2$ or the like in order to secure crystallinity during growth of gallium oxide ($Ga_2O_3$) of the heterogeneous thin film 200. A thickness of the insulator may be between about 10 nm and about 50 nm.

In this case, one of the first semiconductor layer 220 and the second semiconductor layer 230 includes gallium oxide ($Ga_2O_3$) and the other includes silicon (Si). That is, when the first semiconductor layer 220 includes gallium oxide ($Ga_2O_3$), the second semiconductor layer 230 includes silicon (Si), while when the second semiconductor layer 230 includes gallium oxide ($Ga_2O_3$), the first semiconductor layer 220 includes silicon (Si).

The first semiconductor layer 220 and the second semiconductor layer 230 may be spaced apart at a predetermined distance in the horizontal direction or they may be heterogeneously bonded. Or, an insulating layer may be inserted between the first semiconductor layer 220 and the second semiconductor layer 230.

FIGS. 2 to 13 are plan views illustrating various planar shapes of the heterogeneous thin film 200 of a semiconductor module. Herein, the planar shapes refer to shapes of the heterogeneous thin film 200 when viewed from the top of one surface of the substrate 100.

As shown in FIGS. 2 to 13, in the heterogeneous thin film 200, the first semiconductor layer 220 and the second semiconductor layer 230 may be variously changed depending on disposition of the semiconductor device.

Figure 2:
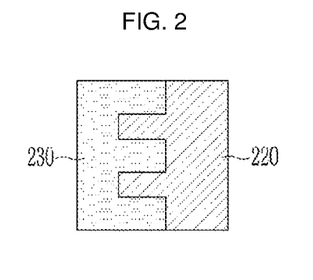
FIGS. 2 to 13 are plan views illustrating various planar shapes of heterogeneous thin films of a semiconductor module.

For example, as shown in FIG. 2, the planar shape of the first semiconductor layer 220 and the second semiconductor layer 230 may be a zigzag shape on the boundary. In other words, the first semiconductor layer 220 and the second semiconductor layer 230 may respectively include a plurality of protruding portions in the horizontal direction of the substrate 100, and the protruding portions of the first semiconductor layer 220 and the protruding portions of the second semiconductor layer 230 may be alternately engaged each other.

Figure 3:
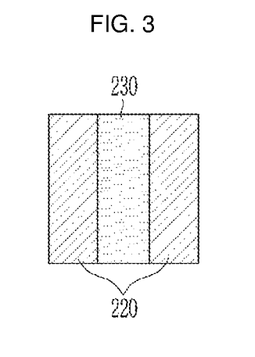

For another example, as shown in FIG. 3, either one of the first semiconductor layer 220 and the second semiconductor layer 230 may be located at both edges on the substrate 100, while the other one may be located between both of the edges. FIG. 3 shows that the first semiconductor layer 220 may be located at both edges on the substrate 100, while the second semiconductor layer 230 is located between the first semiconductor layers 220 at the edges.

For still another example, as shown in FIGS. 4 to 11, either one of the first semiconductor layer 220 and the second semiconductor layer 230 may be located in a peripheral region on the substrate 100, while the other one may be located in an inner region surrounded by the peripheral region. FIGS. 4 to 11 show that the second semiconductor layer 230 may be disposed in the peripheral region on the substrate 100, while the first semiconductor layer 220 is surrounded with the second semiconductor layer 230.

The peripheral region may have a planar shape such as quadrangular, circular, oval, or polygonal shape. FIGS. 4 to 9 show that the peripheral region has a quadrangular planar shape, FIG. 10 shows that the peripheral region has a circular planar shape, and FIG. 11 show that the peripheral region has a hexagonal planar shape.

The inner region may also have a quadrangular, circular, oval, polygonal or polygonal shape including protruding portions on corners or sides, or a cross-shaped planar shape.

Figure 4:
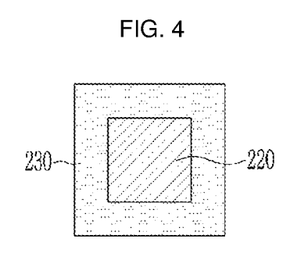
Figure 5:
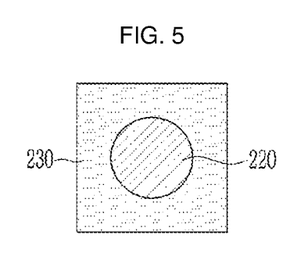
Figure 6:
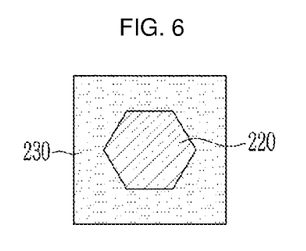
Figure 7:
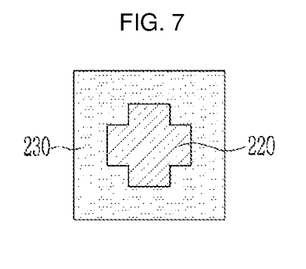
Figure 8:
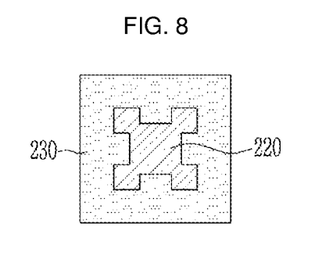
Figure 9:
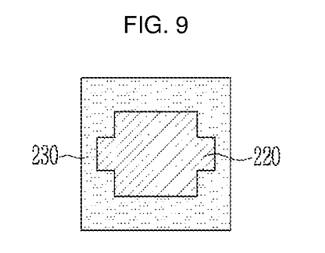
Figure 10:
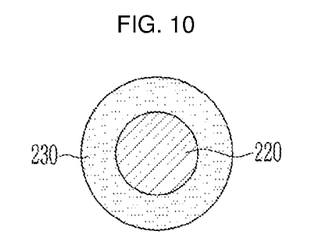
Figure 11:
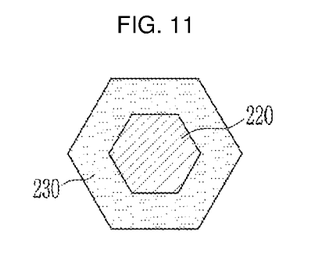

FIG. 4 shows that the inner region has a quadrangular planar shape, FIGS. 5 and 10 show that the inner region has a circular planar shape, FIGS. 6 and 11 show that the inner region has a hexagonal planar shape, and FIG. 7 show that the inner region has a cross-shaped planar shape. FIG. 8 shows that the inner region has a quadrangular planar shape including quadrangular protruding portions at each of the four corners, and in FIG. 9, the quadrangular planar shape of the inner region has the protruding portions at two facing sides.

Figure 12:
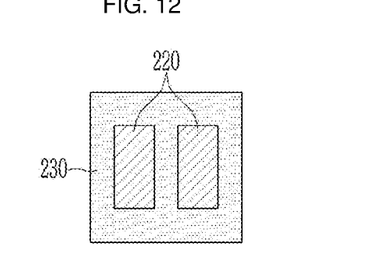

For still another example, as shown in FIG. 12, the inner region is divided into a plurality of portions, and each divided portion of the inner region may be surrounded by the peripheral region. In FIG. 12, the first semiconductor layer 220 may be divided into two inner regions each having a quadrangular planar shape, and the second semiconductor layer 230 surrounds the two divided first semiconductor layers 220.

Figure 13:
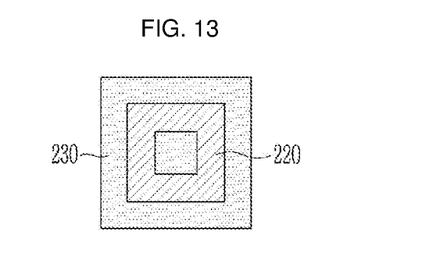

For still another example, as shown in FIG. 13, the heterogeneous thin film 200 further includes a second inner region surrounded with the inner region, and the second inner region may include the same semiconductor layer as the peripheral region. In FIG. 13, the second semiconductor layer 230 is surrounded by the first semiconductor layer 220, and then, the first semiconductor layer 220 is again surrounded by the second semiconductor layer 230.

The first semiconductor device 300 is disposed on the first semiconductor layer 220 of the heterogeneous thin film 200, and the second semiconductor device 400 is disposed on the second semiconductor layer 230 of the heterogeneous thin film 200.

The first semiconductor device 300 may include a first semiconductor layer 220 and an upper region 320 of the first semiconductor layer on the first semiconductor layer 220 and the second semiconductor device 400 may include a second semiconductor layer 230 and an upper region 420 of the second semiconductor layer on a second semiconductor layer 230.

Impurities may be implanted into the first semiconductor layer 220 or the second semiconductor layer 230. Accordingly, the first semiconductor layer 220 or the second semiconductor layer 230 may include a P-type region, an N-type region, or both of them in each partial region within the first semiconductor layer 220 or the second semiconductor layer 230.

In addition, the first semiconductor layer 220 or the second semiconductor layer 230 may be formed by stacking two or more epitaxial layers having different impurity concentrations depending on an impurity injection concentration. For example, when the first semiconductor layer 220 includes gallium oxide ($Ga_2O_3$), the first semiconductor layer 220 may be composed of two or more stacked layers selected from a gallium oxide ($Ga_2O_3$)-based buffer layer, an N− type gallium oxide ($Ga_2O_3$) epitaxial layer, an N-type gallium oxide ($Ga_2O_3$) epitaxial layer, and an N+ type gallium oxide ($Ga_2O_3$) epitaxial layer.

In addition, the first semiconductor layer 220 or the second semiconductor layer 230 may include an insulating layer. The insulating layer may be formed after removing a partial region of the first semiconductor layer 220 or the second semiconductor layer 230 by etching and the like.

Each of the upper region 320 of the first semiconductor layer or the upper region 420 of the second semiconductor layer may include an insulating layer or a metal layer.

The first semiconductor device 300 and the second semiconductor device 400 may be electrically connected through a metal layer by a wire or a metal line. The metal layer may include a material capable of ohmic and Schottky contact such as Cr, Pt, Pd, Au, Ni, Ag, Cu, Al, Mo, In, Ti, and the like.

For example, the first semiconductor device 300 may be a power semiconductor device. Herein, the first semiconductor layer 220 may include gallium oxide ($Ga_2O_3$).

For example, the first semiconductor device may include a field effect transistor (FET), a metal-oxide-semiconductor field effect transistor (MOSFET), an insulated gate bipolar transistor (IGBT), a bipolar junction transistor (BJT), a Schottky diode, a PN diode, or a combination thereof.

Figure 14:
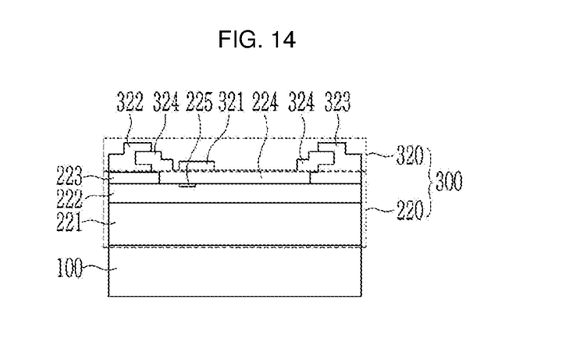
FIG. 14 is a view illustrating an embodiment in which the first semiconductor device is a metal-oxide-semiconductor field effect transistor (MOSFET).

For example, an embodiment in which the first semiconductor device 300 is a metal-oxide-semiconductor field effect transistor (MOSFET) is illustrated in FIG. 14.

Referring to FIG. 14, the first semiconductor device 300 that is a field effect transistor includes the first semiconductor layer 220 and the upper region 320 of the first semiconductor layer.

The first semiconductor layer 220 includes a gallium oxide-based buffer layer 221, an N− type gallium oxide epitaxial layer 222, and an N+ type gallium oxide epitaxial layer 223, and in a partial region of the N+ type gallium oxide epitaxial layer 223, a first insulating layer 224 is included. In addition, the first semiconductor layer 220 includes a P-type region 225 in a partial region of the N− type gallium oxide epitaxial layer 222 under the first insulating layer 224.

The upper region 320 of the first semiconductor layer 220 includes a gate electrode 321 overlapped with the P-type region 225 on the first insulating layer 224 of the first semiconductor layer 220, a source electrode 322 or a drain electrode 323 on the N− type gallium oxide epitaxial layer 222 of the first semiconductor layer 220, and a second insulating layer 324 between the gate electrode 321 and each source electrode 322 and drain electrode 323.

Figure 15:
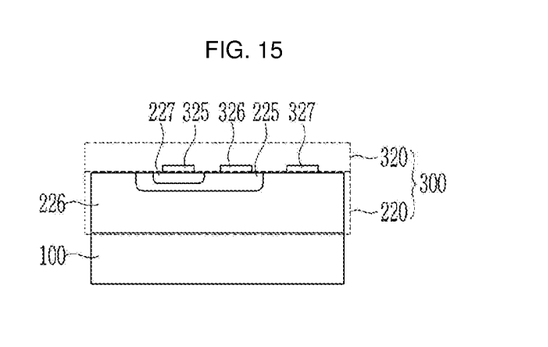
FIG. 15 is a view illustrating an embodiment in which the first semiconductor device is a bipolar junction transistor (BJT).

For example, an embodiment in which the first semiconductor device 300 is a bipolar junction transistor (BJT) is illustrated in FIG. 15.

Referring to FIG. 15, the first semiconductor device 300 that is a bipolar junction transistor includes a first semiconductor layer 220 and an upper region 320 of the first semiconductor layer.

The first semiconductor layer 220 includes an N− type gallium oxide epitaxial layer 226, a P-type region 225 in a partial region of the N-type gallium oxide epitaxial layer 226, and an N-type region 227 in a partial region of the P-type region 225.

The upper region 320 of the first semiconductor layer includes an emitter electrode 325 on the N-type region 227, a base electrode 326 on the P-type region 225, and a collector electrode 327 on an N-type gallium oxide epitaxial layer 226.

Figure 16:
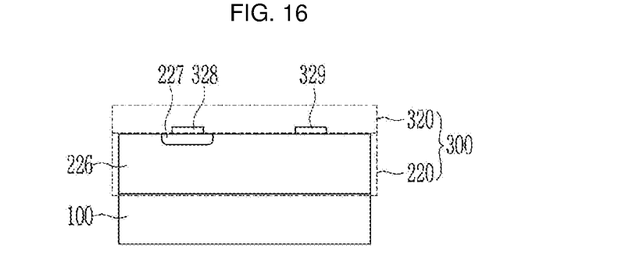
FIG. 16 is a view illustrating an embodiment in which the first semiconductor device is a Schottky diode.

For example, an embodiment in which the first semiconductor device 300 is a Schottky diode is illustrated in FIG. 16.

Referring to FIG. 16, the first semiconductor device 300 that is a Schottky diode includes a first semiconductor layer 220 and an upper region 320 of the first semiconductor layer.

The first semiconductor layer 220 includes an N-type gallium oxide epitaxial layer 226 and an N-type region 227 in a partial region of the N-type gallium oxide epitaxial layer 226.

The upper region 320 of the first semiconductor layer includes a cathode 328 on the N-type region 227 and an anode 329 on the N-type gallium oxide epitaxial layer 226.

For example, the second semiconductor device 400 may include a control element, a temperature sensor, a current sensor, a protection circuit, or a combination thereof. In this case, the second semiconductor layer 230 may include silicon (Si).

For example, when the second semiconductor device 400 is a control element, the control element may include an integrated circuit (IC) including a capacitor, a resistor, an inductor, a CMOS, a field effect transistor (FET), a metal-oxide-semiconductor field effect transistor (MOSFET), a bipolar junction transistor (BJT), a diode, or a combination thereof.

In this way, in the semiconductor module, a power semiconductor based on a gallium oxide ($Ga_2O_3$) material, which is an UWBG (Ultra-Wide Band Gap) material, and a control element such as a silicon (Si)-based gate driver may be manufactured into a single device rather than separate devices.

Accordingly, in the semiconductor module, by optimizing and minimizing the length of a wire and a metal line for electrical connection, electrical parasitic components (capacitance, inductance, etc.) may be reduced to improve switching characteristics.

Accordingly, in the semiconductor module, a volume of passive devices inside and outside the system may be reduced by increasing a switching speed, and reducing switching energy loss to reduce heat generation, a weight and a volume of cooling parts are reduced by evenly distributing a heating portion according to the operation of the device or by artificially placing main devices that cause heat in a place where heat is emitted smoothly, and a weight and a volume of components of the system may be reduced, the system may be simplified, and the life-span and reliability of the device may be increased by increasing the energy use efficiency.

A method of manufacturing a semiconductor module according to an embodiment includes forming a first semiconductor layer on a substrate, removing a partial region of the first semiconductor layer, and then forming a second semiconductor layer in the region from which the first semiconductor layer is removed to form a heterogeneous thin film, and forming a first semiconductor device and a second semiconductor device on the heterogeneous thin film.

FIGS. 17 to 24 are views sequentially illustrating a method of manufacturing a semiconductor module according to another embodiment.

Figure 17:
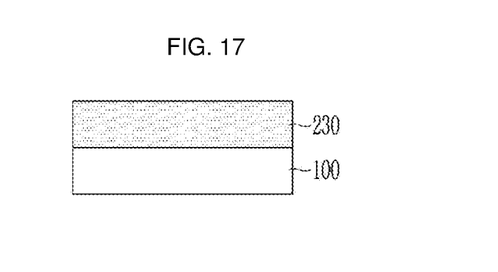
FIGS. 17 to 24 are views sequentially illustrating a method of manufacturing a semiconductor module according to another embodiment.

Referring to FIG. 17, the second semiconductor layer 230 is first formed on the substrate 100. The second semiconductor layer 230 may include gallium oxide ($Ga_2O_3$) or silicon (Si). Herein, a case that the second semiconductor layer 230 includes silicon (Si) is described as an example.

Figure 18:
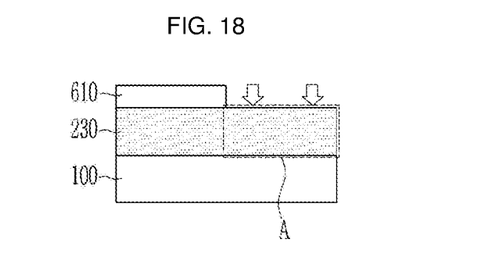

Referring to FIG. 18, after forming a first mask 610 on a partial region of the second semiconductor layer 230, the other partial region (A region) of the second semiconductor layer 230 where the first mask 610 is not formed is removed. Herein, the first mask 610 may include a photoresist or an oxide, and the second semiconductor layer 230 may be removed by dry etching or wet etching.

Figure 19:
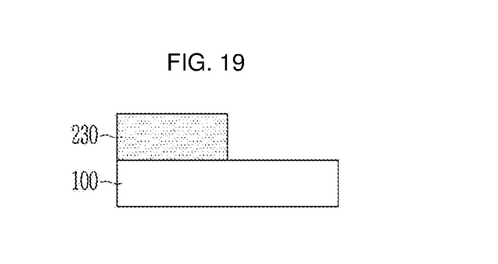
Figure 20:
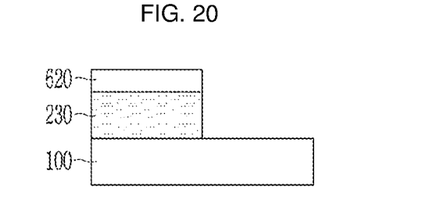

Referring to FIGS. 19 and 20, after removing the first mask 610 remaining on the second semiconductor layer 230, a second mask 620 is formed on the second semiconductor layer 230. However, the first mask 610 may not be removed but reused as the second mask 620. The second mask 620 may include, like the first mask 610, the photoresist or oxide.

Figure 21:
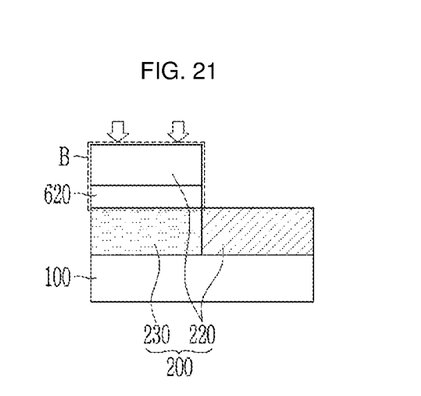

Referring to FIG. 21, on the substrate 100 and the second mask 620, the first semiconductor layer 220 is formed. The first semiconductor layer 220 may include gallium oxide ($Ga_2O_3$) or silicon (Si). Herein, a case that the first semiconductor layer 220 includes gallium oxide ($Ga_2O_3$) is described as an example.

The first semiconductor layer 220 may be deposited by hydride vapor phase epitaxy (HVPE), pulsed laser deposition (PLD), metal-organic chemical vapor deposition (MOCVD), or mist-chemical vapor deposition (Mist-CVD) and a deposition thickness of the first semiconductor layer 220 may be about 0.1 μm to about 10 μm.

Figure 22:
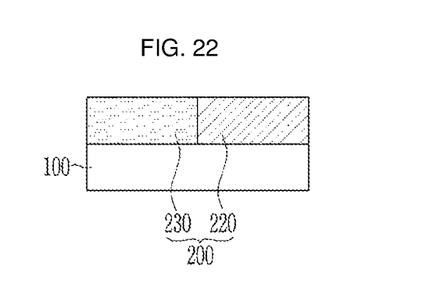

Referring to FIG. 22, the second mask 620 and the first semiconductor layer 220 formed on the second mask 620 are all removed (the B region of FIG. 21). The first semiconductor layer 220 may be removed by wet etching.

Figure 23:
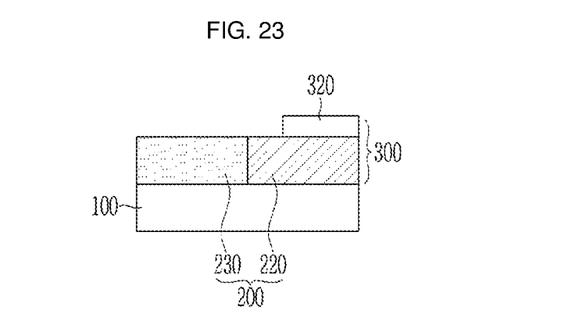
Figure 24:
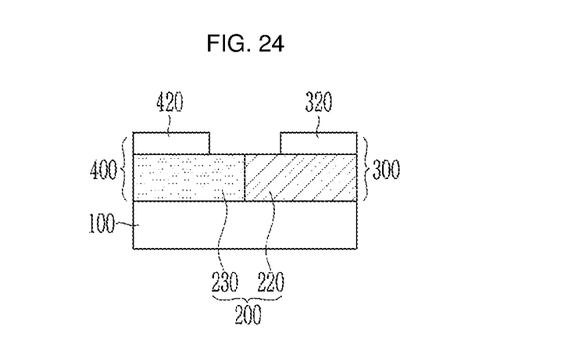

Hereinafter, as shown in FIGS. 23 and 24, the first semiconductor device 300 is formed on the first semiconductor layer 220 of the heterogeneous thin film 200, and the second semiconductor device 400 is formed on the second semiconductor layer 230 of the heterogeneous thin film 200.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A semiconductor module comprising:
   a substrate;
   a heterogeneous thin film comprising a first semiconductor layer disposed on a first region of the substrate and a second semiconductor layer disposed on a second region of the substrate;
   a first semiconductor device disposed at a surface of the first semiconductor layer of the heterogeneous thin film; and
   a second semiconductor device disposed at a surface of the second semiconductor layer of the heterogeneous thin film;
   wherein one of the first semiconductor layer or the second semiconductor layer comprises gallium oxide ($Ga_2O_3$) and the other includes silicon (Si); and
   wherein one of the first semiconductor layer or the second semiconductor layer is disposed in a peripheral region on the substrate and the other one of the first semiconductor layer or the second semiconductor layer is disposed in an inner region surrounded by the peripheral region.

2. The semiconductor module of claim 1, wherein the substrate comprises silicon (Si), silicon carbide (SiC), sapphire, or gallium oxide ($Ga_2O_3$).

3. The semiconductor module of claim 1, wherein the first semiconductor layer and the second semiconductor layer are spaced apart from each other or a boundary between the first semiconductor layer and the second semiconductor layer is a heterojunction.

4. The semiconductor module of claim 1, wherein a planar shape of a boundary between the first semiconductor layer and the second semiconductor layer is a zigzag shape.

5. The semiconductor module of claim 1, wherein the one of the first semiconductor layer or the second semiconductor layer is disposed at both side edges of the substrate and the other one of the first semiconductor layer or the second semiconductor layer is disposed between both side edges of the substrate.

6. The semiconductor module of claim 1, wherein the peripheral region has a quadrangular, circular, oval, or polygonal planar shape.

7. The semiconductor module of claim 1, wherein the inner region has a quadrangular, circular, oval, or polygonal shape including protruding portions on corners or sides, or a cross-shaped planar shape.

8. The semiconductor module of claim 1, wherein:
   the inner region is divided into a plurality of portions; and
   each of the plurality of portions is surrounded by the peripheral region.

9. The semiconductor module of claim 1, wherein the heterogeneous thin film further comprises a second inner region surrounded by the inner region, and the second inner region comprises the same semiconductor layer as the peripheral region.

10. The semiconductor module of claim 1, wherein the first semiconductor device is a power semiconductor device.

11. The semiconductor module of claim 10, wherein the first semiconductor device comprises a field effect transistor (FET), a metal-oxide-semiconductor field effect transistor (MOSFET), an insulated gate bipolar transistor (IGBT), a bipolar junction transistor (BJT), a Schottky diode, a PN diode, or a combination thereof.

12. The semiconductor module of claim 1, wherein the second semiconductor device comprises a control element, a temperature sensor, a current sensor, a protection circuit, or a combination thereof.

13. The semiconductor module of claim 12, wherein the control element comprises an integrated circuit (IC) including a capacitor, a resistor, an inductor, a CMOS, a field effect transistor (FET), a metal-oxide-semiconductor field effect transistor (MOSFET), a bipolar junction transistor (BJT), a diode, or a combination thereof.

14. The semiconductor module of claim 1, wherein each of the first semiconductor device and the second semiconductor device comprises an insulating layer, a metal layer, or a combination thereof.

15. The semiconductor module of claim 1, wherein the first semiconductor device and the second semiconductor device are electrically connected by a wire or a metal line.

16. A method of manufacturing the semiconductor module of claim 1, the method comprising:
forming the first semiconductor layer on the substrate;
forming the heterogeneous thin film by removing a portion of the first semiconductor layer on the first region of the substrate and then forming the second semiconductor layer on the first region of the first semiconductor layer;
forming the first semiconductor device on the first semiconductor layer of the heterogeneous thin film; and
forming the second semiconductor device on the second semiconductor layer of the heterogeneous thin film.

17. The method of claim 16, wherein forming the heterogeneous thin film comprises:
forming a first mask on the first semiconductor layer on the second region of the substrate;
removing the portion of the first semiconductor layer on which the first mask is not formed;
removing the first mask;
forming a second mask over the first semiconductor layer;
forming the second semiconductor layer on the first region of the substrate and the second mask; and
removing the second mask and the second semiconductor layer formed on the second mask on the second region of the substrate.

18. The method of claim 17, wherein the first mask and the second mask each independently comprise a photoresist or an oxide.

19. The method of claim 16, wherein forming the heterogeneous thin film comprises:
forming a mask on the first semiconductor layer on the second region of the substrate;
removing the portion of the first semiconductor layer on which the mask is not formed;
forming the second semiconductor layer on the first region of the substrate and the mask; and
removing the mask and the second semiconductor layer formed on the mask on the second region of the substrate.

20. A semiconductor module comprising:
a substrate;
a heterogeneous thin film comprising a first semiconductor layer disposed on a first region of the substrate and a second semiconductor layer disposed on a second region of the substrate;
a first semiconductor device disposed at a surface of the first semiconductor layer of the heterogeneous thin film, wherein the first semiconductor device comprises a power semiconductor device; and
a second semiconductor device disposed at a surface of the second semiconductor layer of the heterogeneous thin film, wherein the second semiconductor device comprises a control element, a temperature sensor, a current sensor, or a protection circuit;
wherein one of the first semiconductor layer or the second semiconductor layer comprises gallium oxide ($Ga_2O_3$) and the other includes silicon (Si); and
wherein one of the first semiconductor layer or the second semiconductor layer is disposed in a peripheral region on the substrate and the other one of the first semiconductor layer or the second semiconductor layer is disposed in an inner region surrounded by the peripheral region.

* * * * *